United States Patent
Hayashi et al.

[11] Patent Number: 6,133,711
[45] Date of Patent: Oct. 17, 2000

[54] COMBINATION BATTERY CHARGER AND BATTERY DRIVEN POWER SUPPLY

[75] Inventors: Isao Hayashi, Tokyo; Takashi Narasawa; Akira Fukushima, both of Yokohama; Tsutomu Nishikawa, Chigasaki, all of Japan

[73] Assignee: Canon Kabushiki Kaisha, Tokyo, Japan

[21] Appl. No.: 09/039,704

[22] Filed: Mar. 16, 1998

[30] Foreign Application Priority Data

Mar. 26, 1997 [JP] Japan .................................. 9-073690
Aug. 20, 1997 [JP] Japan .................................. 9-223535

[51] Int. Cl.$^7$ .............................. H02J 7/00; G01R 27/04
[52] U.S. Cl. ...................... 320/128; 320/134; 320/136; 320/106; 340/636; 324/427
[58] Field of Search .................................. 320/111, 112, 320/106, 126, 128, 134, 135, 136; 340/636; 324/427

[56] References Cited

U.S. PATENT DOCUMENTS

| | | | |
|---|---|---|---|
| 3,886,426 | 5/1975 | Daggett | 320/117 |
| 4,064,447 | 12/1977 | Edgell et al. | 320/111 |
| 5,218,284 | 6/1993 | Burns et al. | 320/112 |
| 5,341,084 | 8/1994 | Gotoh et al. | 324/427 |
| 5,406,266 | 4/1995 | Mino et al. | 340/636 |
| 5,557,188 | 9/1996 | Piercey | 320/106 |
| 5,652,499 | 7/1997 | Morita et al. | 320/112 |

*Primary Examiner*—Peter S. Wong
*Assistant Examiner*—Gregory J. Toatley, Jr.
*Attorney, Agent, or Firm*—Robin, Blecker & Daley

[57] ABSTRACT

A charging device includes a charging circuit for performing a charging action on a secondary battery, a power supplying circuit for supplying power to a load device connected to the charging device, a mode change-over circuit for selection from between a charge mode in which the charging action on the secondary battery is performed and a discharge mode in which power is supplied to the load device, and a control circuit for, when the charge mode is selected by the mode change-over circuit, causing the charging circuit to perform the charging action on the secondary battery and for, when the discharge mode is selected by the mode change-over circuit, causing the power supplying circuit to supply power from the secondary battery to the load device in a state in which the secondary battery is mounted on the charging device.

15 Claims, 15 Drawing Sheets

COMBINATION BATTERY CHARGER AND BATTERY DRIVEN POWER SUPPLY

BACKGROUND OF THE INVENTION

1. Field of the Invention

The present invention relates to a charging device for charging a secondary battery used as a power source for an electronic apparatus or the like.

2. Description of Related Art

Charging devices (battery chargers) have been arranged in general to have a function of charging a secondary battery and a DC output function of supplying electric power to an apparatus or device (hereinafter referred to as a load device) connected to the charging device.

FIG. 1 shows by way of example the arrangement of the conventional charging device. Referring to FIG. 1, there are illustrated a charging device 24 arranged to charge a secondary battery 25, a DC output jack 26, a DC plug 27, a DC coupler 28, and a load device 29.

In charging the secondary battery 25, the DC plug 27 is removed from the charging device 24 before the secondary battery 25 is mounted on the charging device 24 for charging.

In supplying a DC output to the load device 29, a DC driving action is performed after the DC plug 27 is inserted into the DC output jack 26 and the DC coupler 28 is connected to the load device 29, which is an electronic apparatus or the like. The DC output of the charging device 24 supplied to the load device 29 is obtained by converting an AC input into a DC and is not supplied from the secondary battery 25. In a case where the load device 29 is to be driven by using the secondary battery 25, the secondary battery 25 is removed from the charging device 24 before the secondary battery 25 is mounted and connected to the load device 29.

However, in driving the load device 29 with the secondary battery 25 after charging the second battery 25 (hereinafter referred to as the secondary battery driving), the conventional device necessitates the operator to remove the secondary battery 25 from the charging device 24 before connecting the charging device 24 to the load device 29. Therefore, it has been difficult to promptly drive the load device 29 with the secondary battery 25 depending on the charged state of the secondary battery 25.

Further, according to the arrangement of the conventional charging device, the charged state of the secondary battery 25 is displayed by a display device (not shown) provided on the charging device 24, while, at the time of the secondary battery driving, the residual capacity of the secondary battery 25 is displayed by a display device provided on the secondary battery 25. The conventional arrangement thus has necessitated use of the two display devices.

BRIEF SUMMARY OF THE INVENTION

The invention has been developed to solve the above-stated problems of prior art. It is, therefore, a first object of the invention to provide a charging device which is arranged to have excellent operability.

It is a second object of the invention to provide a charging device of excellent operability which is arranged to permit supply of power to a load device without removing a secondary battery from the charging device and to permit switching between a mode of charging the secondary battery and a mode of supplying power to the load device from the secondary battery.

To attain the above objects, in accordance with an aspect of the invention, there is provided a charging device for charging a secondary battery, which comprises charging means for performing a charging action on the secondary battery, power supplying means for supplying power to a load device connected to the charging device, mode change-over means for selection from between a charge mode in which the charging action on the secondary battery is performed and a discharge mode in which power is supplied to the load device, and control means for, when the charge mode is selected by the mode change-over means, causing the charging means to perform the charging action on the secondary battery and for, when the discharge mode is selected by the mode change-over means, causing the power supplying means to supply power from the secondary battery to the load device in a state in which the secondary battery is mounted on the charging device.

In accordance with another aspect of the invention, there is provided a charging device, in which the power supplying means is controlled to be inoperative while the charging means is in action.

In accordance with a further aspect of the invention, there is provided a charging device, in which the charging means is controlled to be inoperative while the power supplying means is in action.

In accordance with a further aspect of the invention, there is provided a charging device, which further comprises dropped-voltage state detecting means for detecting a dropped-voltage state of the secondary battery, wherein the control means allows a mode to be set as selected by the mode change-over means when the secondary battery is decided to be not in the dropped-voltage state by the dropped-voltage state detecting means, and causes the charging means to perform the charging action on the secondary battery irrespectively of a state of the mode change-over means when the secondary battery is decided to be in the dropped-voltage state by the dropped-voltage state detecting means.

In accordance with a further aspect of the invention, there is provided a charging device, which comprises charging means for charging a secondary battery connected to the charging device, power supplying means for supplying power from the secondary battery to a load device connected to the charging device, and change-over means for switching between use of the charging means and use of the power supplying means.

In accordance with a further aspect of the invention, there is provided a charging device having a function of performing a charging action on a detachably mountable secondary battery and a function of switching between the charging action and a secondary battery driving action in which power is supplied from the secondary battery to a load device connected to the charging device, wherein the charging device allows a plurality of secondary batteries to be mounted thereon for the charging action and the secondary battery driving action, and wherein in the secondary battery driving action, the plurality of secondary batteries are continuously usable by serially switching the plurality of secondary batteries or by connecting the plurality of secondary batteries in parallel.

In accordance with a further aspect of the invention, there is provided a charging device having a function of performing a charging action on a detachably mountable secondary battery and a function of switching between the charging action and a power supplying action in which power is supplied from the secondary battery to a load device connected to the charging device, wherein the charging device includes a single display device which displays both an amount of charging of the secondary battery during the charging action and a residual capacity of the secondary battery during the power supplying action.

The above and other objects and features of the invention will become apparent from the following detailed description of preferred embodiments thereof taken in connection with the accompanying drawings.

DETAILED DESCRIPTION OF THE INVENTION

Hereinafter, preferred embodiments of the invention will be described in detail with reference to the drawings.

Figure 1:
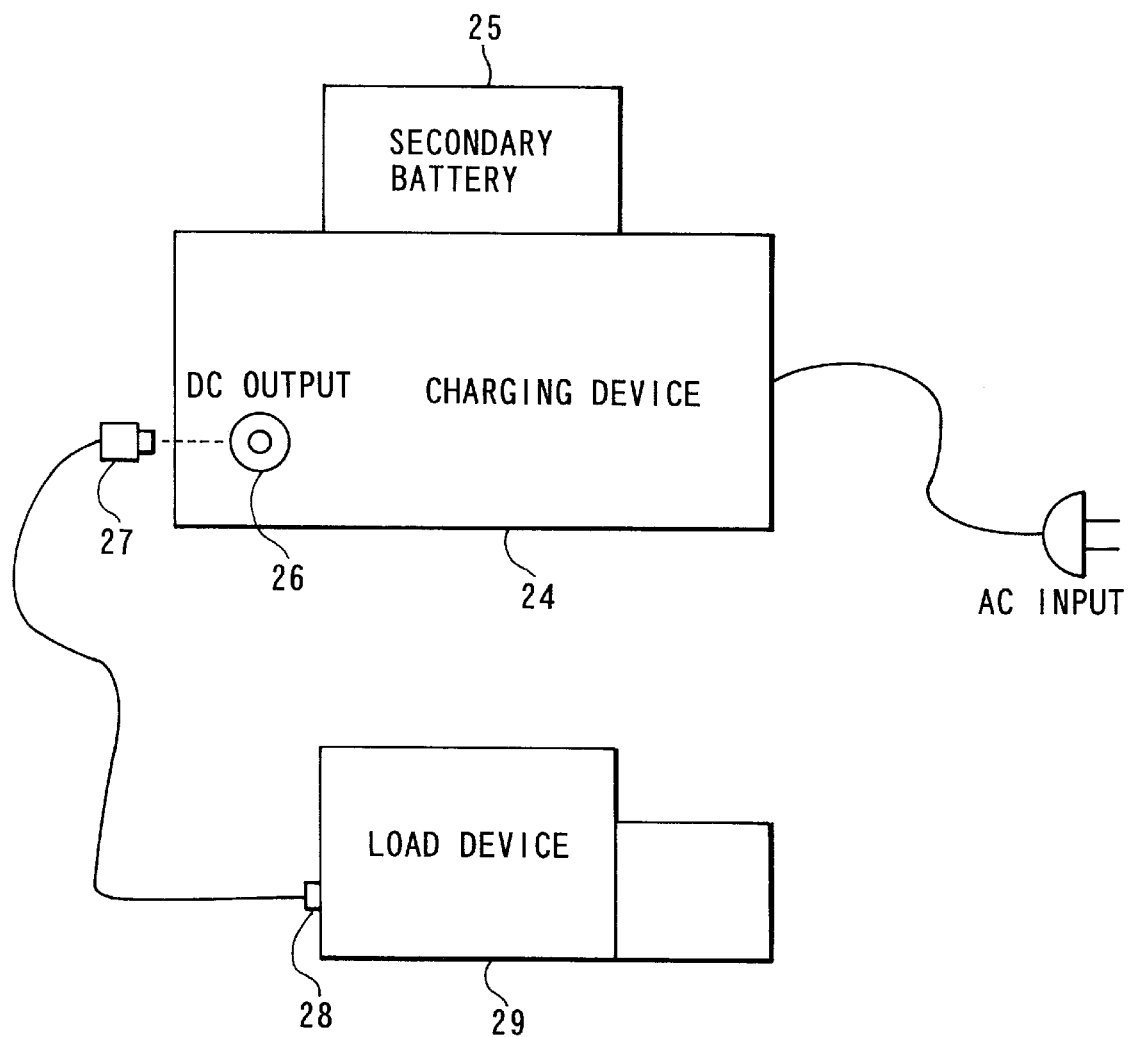
FIG. 1 is a block diagram showing the arrangement of the conventional charging device.
Figure 2:
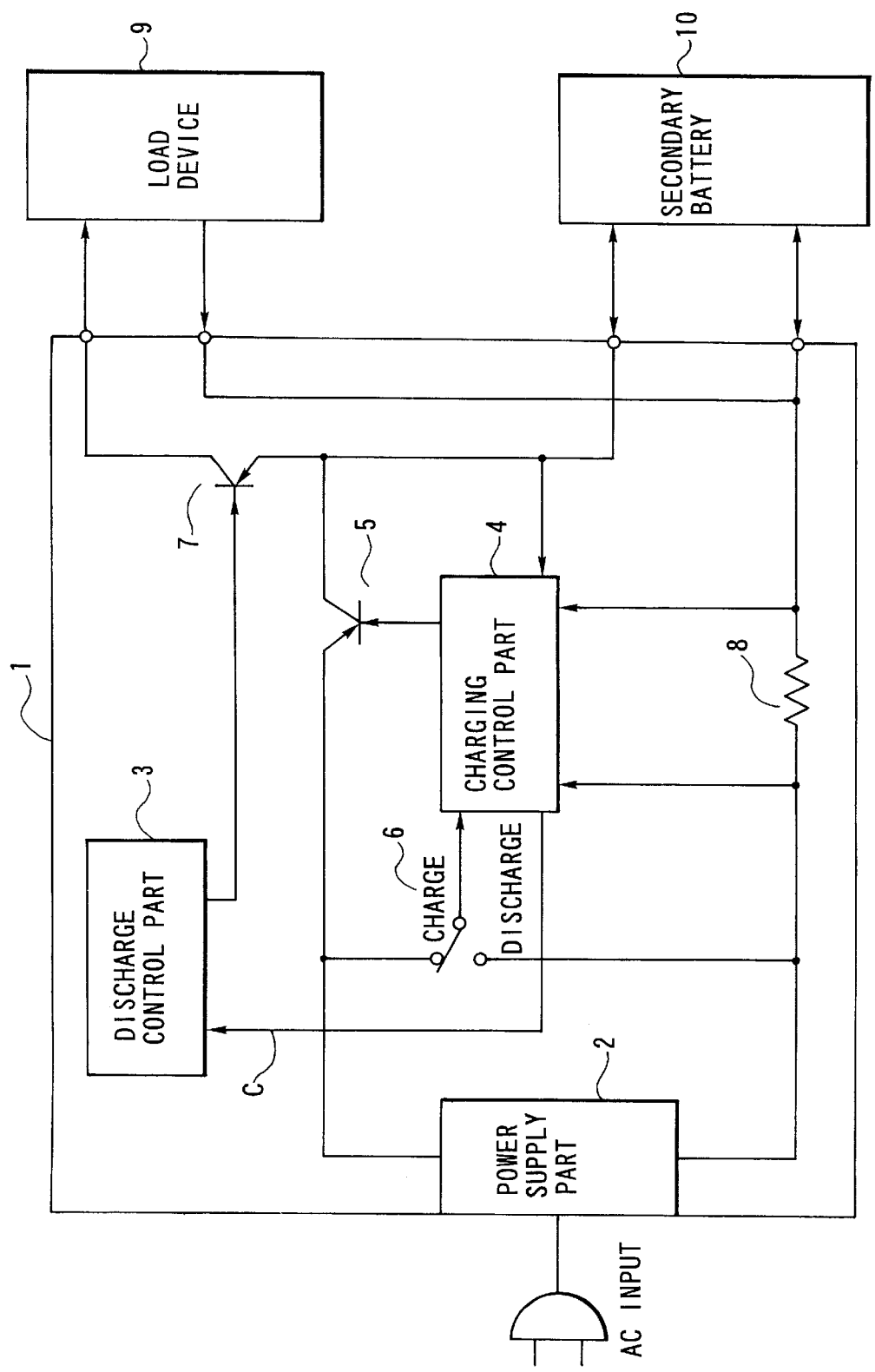
FIG. 2 is a block diagram showing the arrangement of a charging device according to a first embodiment of the invention.

FIG. 2 shows in a block diagram a charging device according to a first embodiment of the invention. In FIG. 2, reference numeral 1 denotes the charging device. A power supply part 2 is arranged to rectify and convert an AC power into a DC power. A discharge control part 3 is arranged as power supplying means to control supply of power from a secondary battery to a load device. A charging control part 4 is arranged as charging means to control a charging current applied to the secondary battery. A transistor 5 is arranged as a switching element to perform on/off switching for a charging action. A mode change-over switch 6 is arranged to perform switching between a charge mode and a discharge mode (a secondary battery driving action). A transistor 7 is arranged as a switching element to perform on/off switching for the secondary battery driving action. A resistor 8 is arranged for detecting the state of charging by detecting a charging current. Reference numeral 9 denotes the load device, and reference numeral 10 denotes the secondary battery.

When there is an AC input with the position of the mode change-over switch 6 on the charge side, the charging device 1 performs a charging action on the secondary battery 10. That is, there is obtained the charge mode. The charging control part 4 then detects the state (position) of the mode change-over switch 6 and controls the charging on/off switch 5. The charging action is carried on until the secondary battery 10 is fully charged, unless the position of the mode change-over switch 6 is shifted to the discharge side.

When the discharge side of the mode change-over switch 6 is selected, power is supplied from the secondary battery 10 to the load device 9 to drive the load device 9 with the secondary battery 10 (secondary battery driving action). That is, there is obtained the discharge mode. In this instance, the charging control part 4 detects the state of the mode change-over switch 6 and turns off the charging on/off switch 5. Then, the charging control part 4 informs the discharge control part 3, through a communication means C, that the secondary battery driving action is selected. The above-stated communication means C may be a signal of high/low level or transmission of data through a serial communication or the like. The communication means C is thus determined according to the system arrangement of the charging device 1.

Upon receipt of communication from the charging control part 4, the discharge control part 3 controls and turns on the discharge on/off switch 7, so that the output of the secondary battery 10 is supplied to the load device 9.

Figure 3:
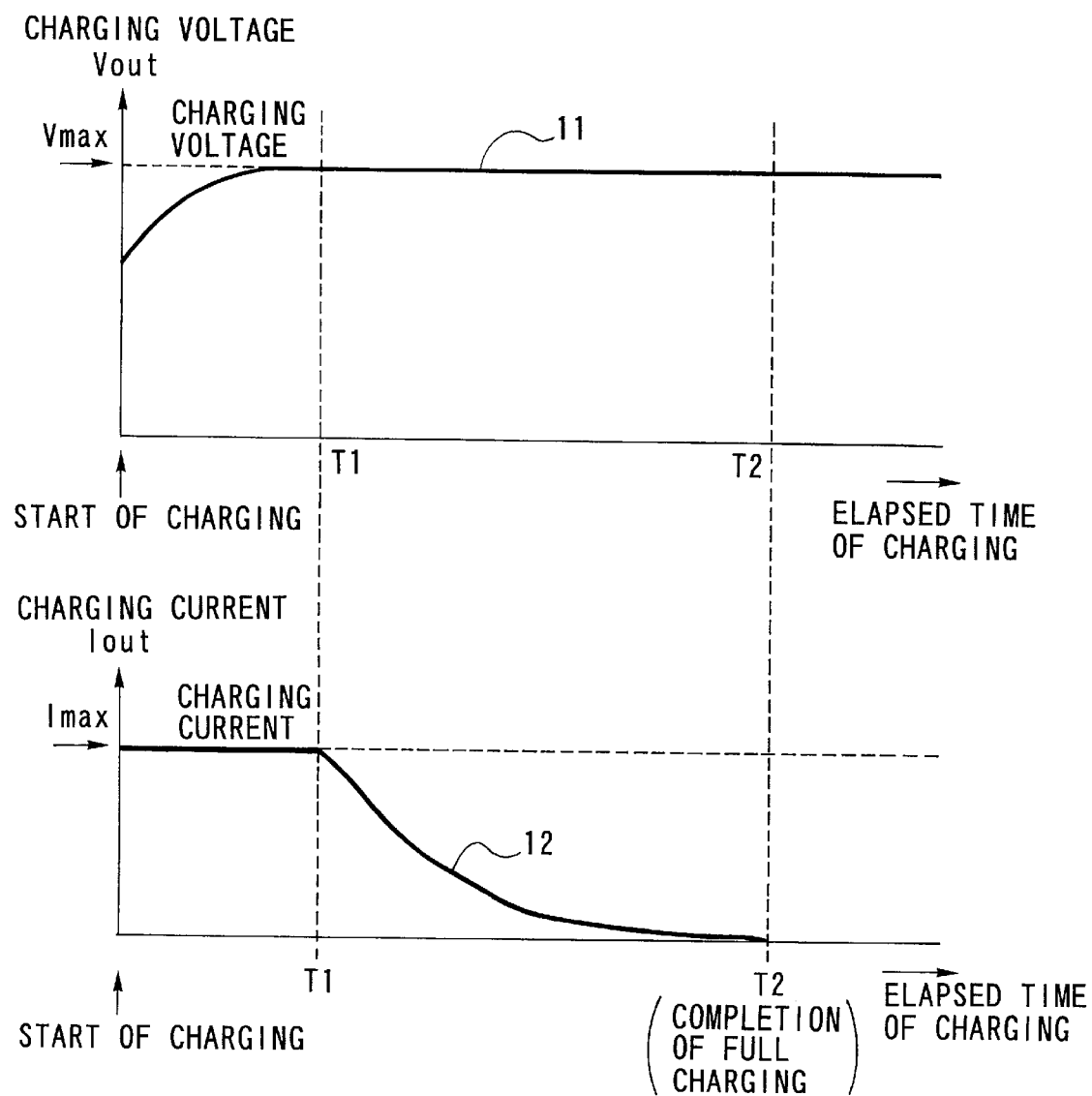
FIG. 3 shows a charging output of the charging device.

FIG. 3 shows a charging output obtained in the charge mode according to a constant-voltage/constant-current method employed in the charging device 1. In FIG. 3, a charging voltage and a charging current are indicated on the ordinate axis, and the elapsed time of charging is indicated on the abscissa axis. There are illustrated a charging voltage curve 11 for the secondary battery and a charging current curve 12 for the secondary battery. The charging voltage reaches a set charging voltage Vmax at a point of time T1. At this time point T1, the charging current begins to drop due to the characteristic of the battery. The charging current drops to reach a set current value at another point of time T2, where the charging action comes to an end to bring about a full charging state.

Figure 4:
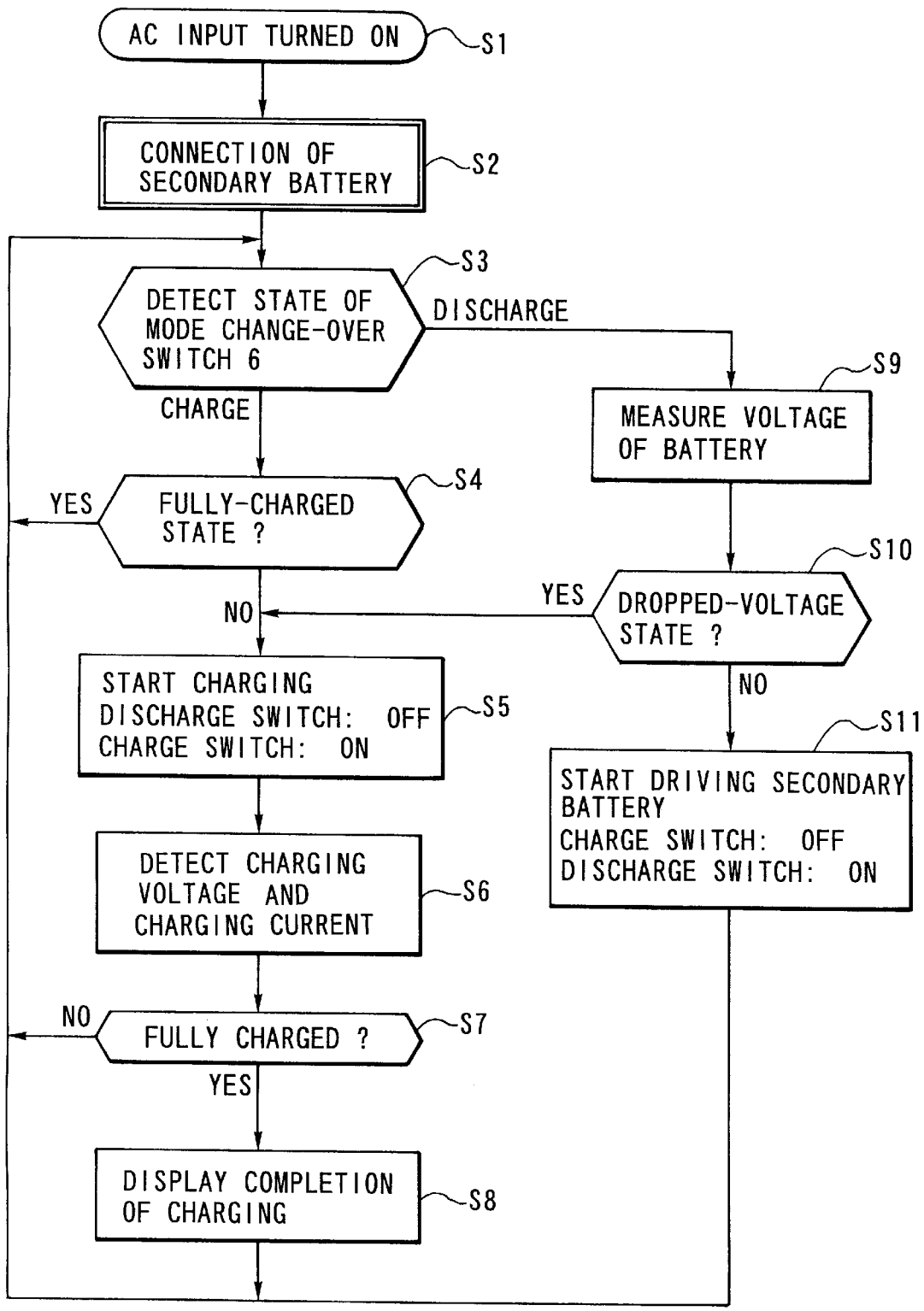
FIG. 4 is a flow chart showing an operation of the charging device in the first embodiment.

FIG. 4 is a flow chart showing an operation of the charging device in the first embodiment. The processes shown in this flow chart are executed by a microcomputer disposed within the charging control part 4. However, the execution of these processes may be arranged to be shared with the discharge control part 3 through the above-stated communication means C. In FIG. 4, a step S1 is a standby state at the start of the flow of operation with an AC input obtained. At a step S2, the secondary battery 10 is connected to the charging device 1. At a step S3, a check is made for the selecting position of the mode change-over switch 6. If the mode change-over switch 6 is found to be on the charge side, the flow proceeds to a step S4 to find if the secondary battery 10 is in a fully-charged state. If so, the flow returns to the step S3.

If the secondary battery 10 is found at the step S4 to be not in the fully-charged state, the flow proceeds to a step S5. At the step S5, the charging action begins. A control signal is sent to the discharge control part 3 through the communication means C. By this control signal, the transistor 7 is turned off (to turn off the discharge switch 7 and to turn on the charge switch 5). At a step S6, the charging control part 4 detects a charging voltage and a charging current. At a step S7, a check is made to find if the secondary battery 10 has been fully charged.

If not, the flow returns to the step S3 to continue the process of charging. If so, the flow proceeds to a step S8. At the step S8, the completion of charging is displayed, and the flow returns to the step S3.

At the step S3, if the position of the mode change-over switch 6 is found to be on the discharge side, the flow branches to a step S9. At the step S9, the voltage of the secondary battery 10 is measured. At a step S10, a check is made to find if the voltage of the secondary battery 10 is in a dropped-voltage state. If so, the flow proceeds to the step S5 to have the second battery 10 charged until the battery voltage is recovered.

The term "dropped-voltage state" as used herein means a preset lower limit level of the battery voltage or a level close to the lower usable limit of the secondary battery. If the secondary battery 10 is found at the step S10 to be not in the dropped-voltage state, the flow of operation proceeds to a step S11. At the step S11, the secondary battery driving action begins to turn off the charging switch 5 and to turn on the discharge switch 7. After the step S11, the flow returns to the step S3 to have power continuously supplied to the load device 9.

The first embodiment is arranged to charge the secondary battery by the constant-voltage/constant-current method and to control the secondary battery driving action as described above. This arrangement is applicable also to control over a battery which is arranged to be charged with a constant current, such as a nickel-cadmium type battery or the like.

The first embodiment is further arranged to select a charging action or a discharging action on the secondary battery by a switching operation on the mode change-over switch 6. However, the arrangement may be changed to automatically make this selection according to the state of the secondary battery. In the case of the first embodiment, the secondary battery is continuously charged until the battery voltage recovers from a dropped-voltage state, if it is in the dropped-voltage state, even while the mode change-over switch is set on the discharge side. In the first embodiment, the function of switching between the charging action on the secondary battery and the driving action with the secondary battery is arranged, by way of example, to be performed by means of the mode change-over switch. That arrangement, however, may be changed to have this function carried out either by reading the state of the secondary battery into a microcomputer through some suitable switch or by performing switching control with some discrete part, such as a transistor or an FET.

As described above, according to the arrangement of the first embodiment, the change-over operation can be carried out with the secondary battery left mounted on the charging device. Therefore, a load device can be easily driven by using the secondary battery without a troublesome operation, such as removing the secondary battery from the charging device and mounting it on the load device.

Since the first embodiment is arranged to be forcibly turned into the charge mode even while the discharge mode for the secondary battery is selected, if the secondary battery is in a dropped-voltage state close to a usable limit, any errors due to the dropped-voltage state can be prevented to ensure a high reliability of the system.

The charging device is arranged to permit a secondary battery to be attached and detached. The charging device is, therefore, not only suitable for a load device which requires a large current and is drivable solely with a secondary battery, but is also capable of charging secondary batteries of varied sizes with contacts commonly arranged for them. Therefore, with the contacts of load devices arranged in common with each other, the charging device can be used for various load devices.

A charging device according to a second embodiment of the invention is next described. This charging device is not only adapted for a video camera but arranged to permit improvement in a display device to be used in supplying power to a load device and in controlling a charging action on a secondary battery.

The following describes the second embodiment as a battery charging system applied to a VTR-integrated type video camera system.

Figure 5:
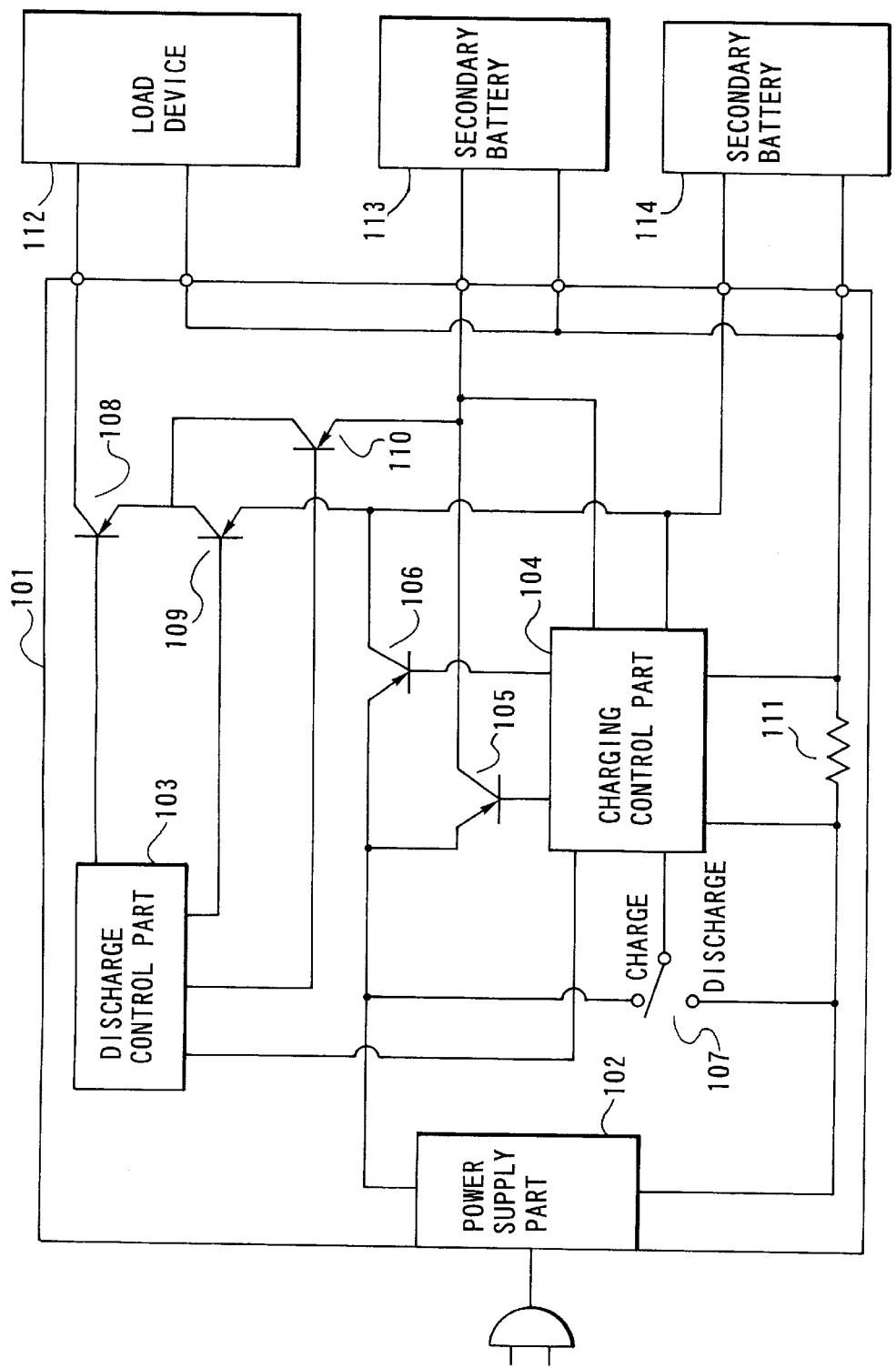
FIG. 5 is a block diagram showing the arrangement of a charging device according to a second embodiment of the invention.

FIG. 5 shows the charging system according to the second embodiment of the invention. Referring to FIG. 5, a charging device 101 includes a power supply part 102 arranged to convert an AC into a DC, a discharge control part 103, a charging control part 104, charging on/off switches 105 and 106, a change-over switch 107 arranged to perform switching between a charging action on a secondary battery and a secondary battery driving action, switches 108, 109 and 110 arranged to turn on and off the secondary battery driving action, and a resistor 111 for detection of a charging current. Reference numeral 112 denotes a load device. Reference numerals 113 and 114 denote secondary batteries to be charged by the charging device 101.

In a case where there is an AC input, the charging device 101 serially charges the secondary batteries 113 and 114 one after another when the change-over switch 107 is on the charge side. The charging control part 104 detects the state (selecting position) of the change-over switch 107 and controls the charging on/off switches 105 and 106. The charging action on the secondary batteries 113 and 114 continues unless the position of the change-over switch 107 is shifted to the discharge side.

When the discharge side of the change-over switch 107 is selected, the load device 112 is driven with the secondary battery 113 or the secondary battery 114. In this instance, the charging control part 104 detects the state of the change-over switch 107 and turns off the charging on/off switches 105 and 106. Then, the charging control part 104 sends information indicating that the charging system is in a state of selecting the secondary battery driving action, i.e., a state of selecting a mode of driving the load device 112 with the secondary battery 113 or 114, to the discharge control part 103 by a communication means. The communication may be carried out by using a high/low signal or by a serial communication.

With the information received from the charging control part 104, the discharge control part 103 controls the discharge on/off switches 108, 109 and 110 to drive the load device 112 with the electric energy of the secondary battery 113 or 114. In this instance, the use of the secondary battery 113 or 114 may be selected in any desired manner. For example, in a case where both of the secondary batteries 113 and 114 are mounted, the secondary battery driving action, i.e., the action of driving the load with a secondary battery, may be carried out by giving priority to the use of the secondary battery 113.

Figure 6:
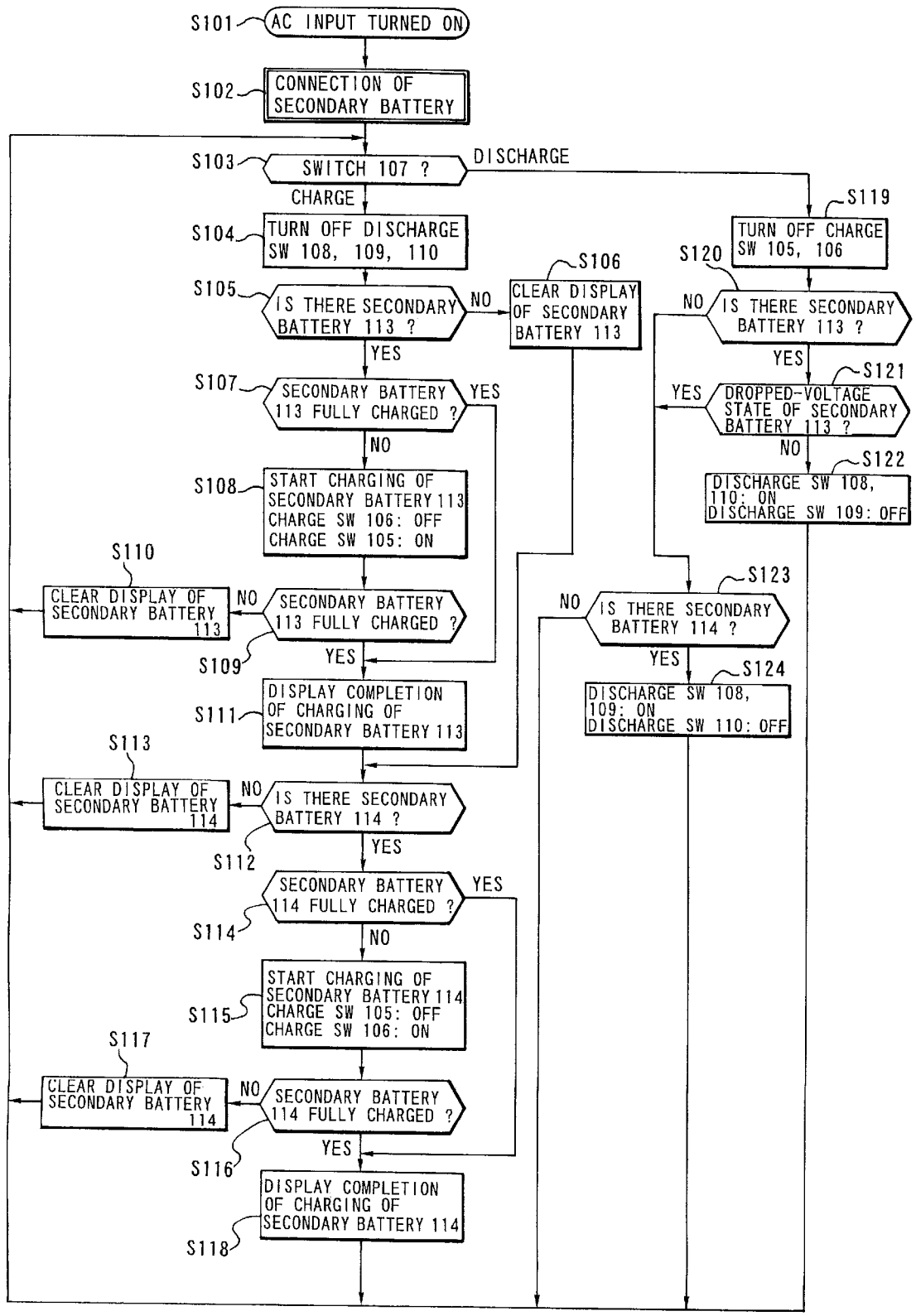
FIG. 6 is a flow chart showing an operation of the charging device in the second embodiment.

FIG. 6 is a flow chart showing the above-stated actions in the second embodiment. Referring to FIG. 6, at a step S101, an AC input is obtained and the charging system is in a standby state. In other words, the flow of operation is at a start. At a step S102, the secondary battery 113 or 114 is connected to the charging device 101. At a step S103, a check is made for the state of the change-over switch 107. If the charge side of the change-over switch 107 is selected, the flow proceeds to a step S104. At the step S104, the discharge switches 108, 109 and 110 are turned off. At a step S105, a check is made to find if the secondary battery 113 is present. If not, the flow branches to a step S106 to clear a display which indicates that the secondary battery 113 is fully charged. The flow then proceeds to a step S112 to make a check for the presence of the other secondary battery 114. If the secondary battery 113 is found to be present at the step S105, the flow proceeds to the next step S107. At the step S107, a check is made to find if the secondary battery 113 is fully charged. If so, the flow proceeds to a step S111 to make a display indicating that the secondary battery 113 is fully charged and proceeds to the step S112 to make the check for the presence of the other secondary battery 114.

If the secondary battery 113 is found at the step S107 to be not fully charged, the flow proceeds to a step S108. At the step S108, the secondary battery 113 begins to be charged by turning off the charge switch 106 and by turning on the charge switch 105. At a step S109, a check is made to find if the secondary battery 113 is fully charged. If not, the flow proceeds to a step S110 to clear a display of a fully-charged state of the secondary battery 113. If so, the flow proceeds from the step S109 to the step S111.

At the step S111, a display is made to indicate that the secondary battery 113 is fully charged. At the step S112, a check is made to find if the secondary battery 114 is present. If not, the flow proceeds to a step S113 to clear a display of a fully-charged state of the secondary battery 114 and waits there. If the secondary battery 114 is found at the step S112 to be present, the flow proceeds to a step S114. At the step S114, a check is made to find if the secondary battery 114 is fully charged. If so, the flow proceeds to a step S118 to display the fully-charged state of the secondary battery 114. If not, the flow proceeds to a step S115. At the step S115, the secondary battery 114 begins to be charged by turning off the charge switch 105 and by turning on the charge switch 106.

At a step S116, a check is made to find if the secondary battery 114 is fully charged. If not, a display indicating that the secondary battery 114 is fully charged is cleared at a step S117 and the charging action is carried on. If so, the flow proceeds from the step S116 to a step S118. At the step S118, a display is made to indicate that the secondary battery 114 is fully charged, and the flow enters into a standby state.

If the position of the change-over switch 107 is found at the step S103 to be on the discharge side, the flow proceeds to a step S119. At the step S119, the charge switches 105 and 106 are turned off. At a step S120, a check is made to find if the secondary battery 113 is present. If not, the flow proceeds to a step S123. If so, the flow proceeds to a step S121. At the step S121, a check is made to find if the secondary battery 113 is in a dropped-voltage state in which the voltage has dropped either down to a lower usable limit or to a level near to the lower limit.

If the secondary battery 113 is found at the step S121 to be not in the dropped-voltage state, the flow of operation proceeds to a step S122. At the step S122, the discharge switches 108 and 110 are turned on and the discharge switch 109 turned off to drive the load device 112 with the secondary battery 113. In cases where the secondary battery 113 is found at the step S120 to be absent or where the secondary battery 113 is found at the step S121 to be in a dropped-voltage state, the flow proceeds to a step S123. At the step S123, a check is made to find if the other secondary battery 114 is present. If not, the flow enters into a standby state. If so, the flow proceeds to a step S124. At the step S124, the secondary battery driving action is performed with the secondary battery 114 by turning the discharge switches 108 and 109 on and the discharge switch 110 off.

In the case of the arrangement of the second embodiment described above, the use of the secondary battery 113 has priority over that of the other secondary battery 114. However, this order of priority is reversible. The charging system can be arranged to control more than two secondary batteries.

According to the arrangement of the second embodiment described, a plurality of secondary batteries can be mounted on the charging device. The plurality of secondary batteries mounted can be continuously charged one after another. The continuous charging permits the load device to be driven over a long period of time. The arrangement gives a charging system of good operability.

Figure 7:
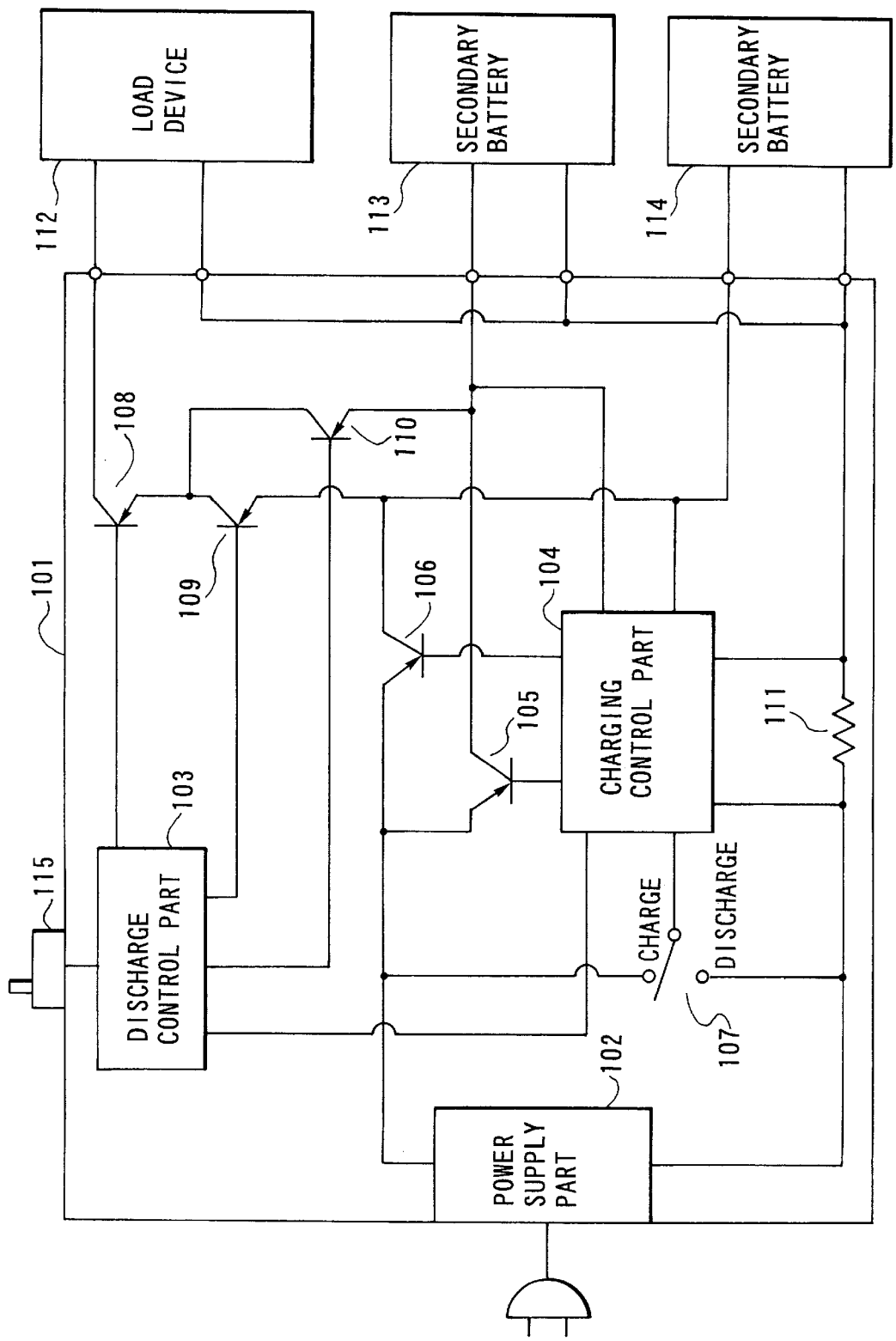
FIG. 7 is a block diagram showing the arrangement of a charging device according to a third embodiment of the invention.

FIG. 7 is a block diagram showing a charging system according to a third embodiment of the invention. In FIG. 7, reference numerals 101 to 114 denote the same parts as those of the second embodiment shown in FIG. 5. In the case of the third embodiment, a priority selection switch 115 is provided for giving priority either to the secondary battery 113 or to the other secondary battery 114. This switch 115 is arranged to be manually operated.

Figure 8:
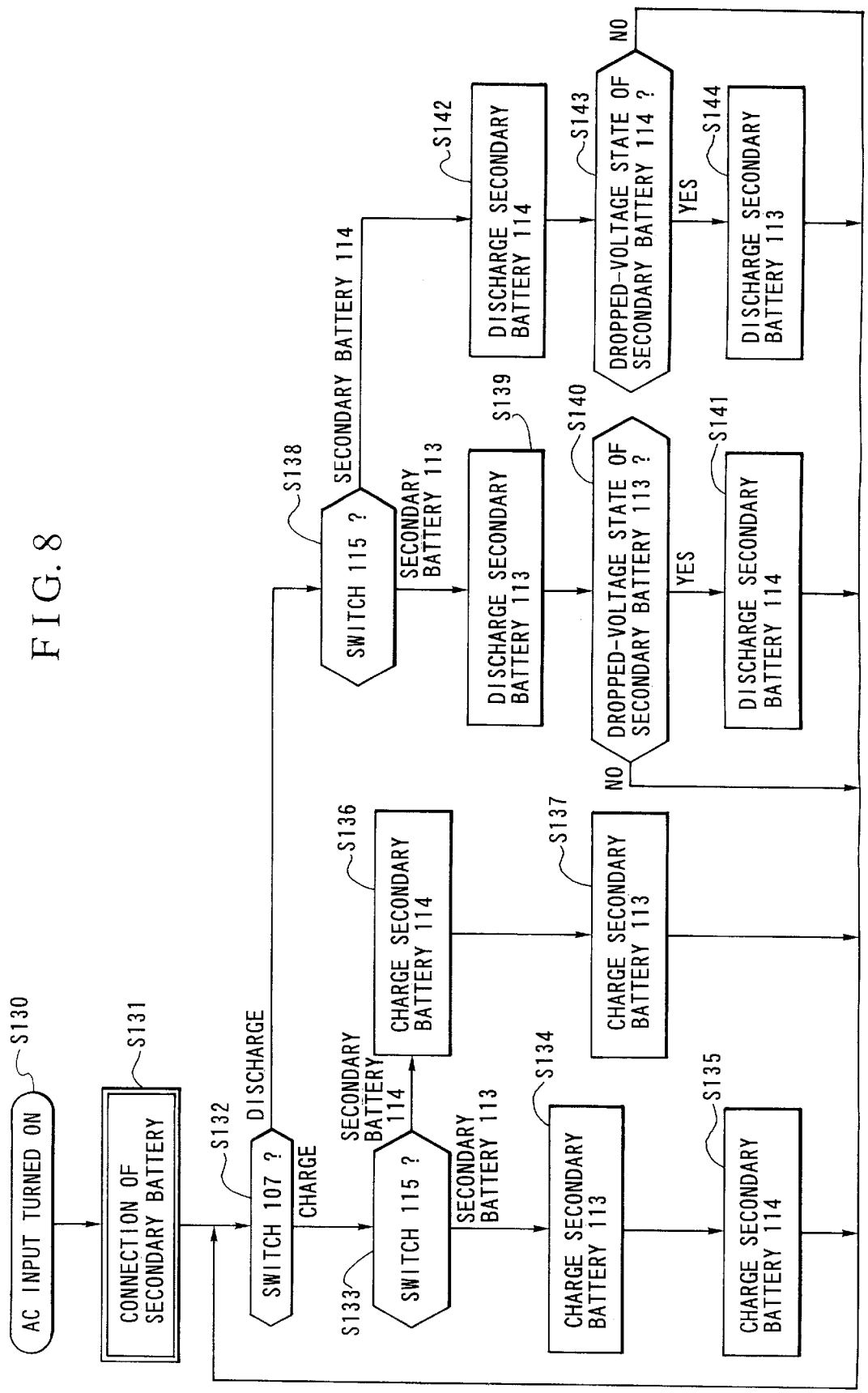
FIG. 8 is a flow chart showing an operation of the charging device in the third embodiment.

FIG. 8 is a flow chart showing the actions of the third embodiment. At a step S130 of FIG. 8, an AC input is obtained and the flow of operation is at a start thereof in a standby state. At a step S131, either the secondary battery 113 or the other secondary battery 114 is connected. At a step 132, a check is made for the state of the change-over switch 107. If the selecting position of the switch 107 is found to be on the charge side, the flow proceeds to a step S133. At the step S133, a check is made for the state of the priority selection switch 115. If the state of the switch 115 is found to be selecting the secondary battery 113, the flow proceeds to a step S134. At the step S134, the secondary battery 113 is charged, having priority over the secondary battery 114. After completion of charging the secondary battery 113, the flow proceeds to a step S135. At the step S135, the other secondary battery 114 is charged.

If the priority selection switch 115 is found at the step S133 to be selecting the secondary battery 114, the flow proceeds to a step S136. At the step S136, the secondary battery 114 is charged, having priority over the secondary battery 113. After completion of charging the secondary battery 114, the flow proceeds to a step S137. At the step S137, the secondary battery 113 is charged.

If the position of the change-over switch 107 is found at the step S132 to be on the discharge side, the flow proceeds to a step S138. At the step S138, a check is made for the state of the priority selection switch 115. If the switch 115 is found to be selecting the secondary battery 113, the flow proceeds to a step S139. At the step S139, the secondary battery 113 is discharged, having priority over the other secondary battery 114. The load device 112 is continuously driven with the secondary battery 113 until a dropped-voltage state of the secondary battery 113 is detected by a check made at the next step S140. Upon detection of the dropped-voltage state at the step S140, the flow proceeds to a step S141. At the step S141, the other secondary battery 114 begins to be discharged.

If the position of the priority selection switch 115 is found at the step S138 to be on the side of the secondary battery 114, the flow proceeds to a step S142. At the step S142, the secondary battery 114 is discharged, having priority over the secondary battery 113. The load device 112 is driven with the secondary battery 114 until a dropped-voltage state of the secondary battery 114 is found by a check made at the next step S143. Upon detection of the dropped-voltage state at the step S143, the flow proceeds to a step S144. At the step S144, the secondary battery 113 begins to be discharged.

The third embodiment is arranged to use the selection switch 115 commonly for charging and discharging the secondary batteries. This arrangement, however, may be changed either to use the selection switch 115 only for discharging or to have selection switches provided separately for discharging and charging.

The third embodiment described above not only gives advantageous effects in the same manner as the second embodiment but also permits the operator to select the order of priority of the secondary batteries as desired in charging and discharging them.

Figure 9:
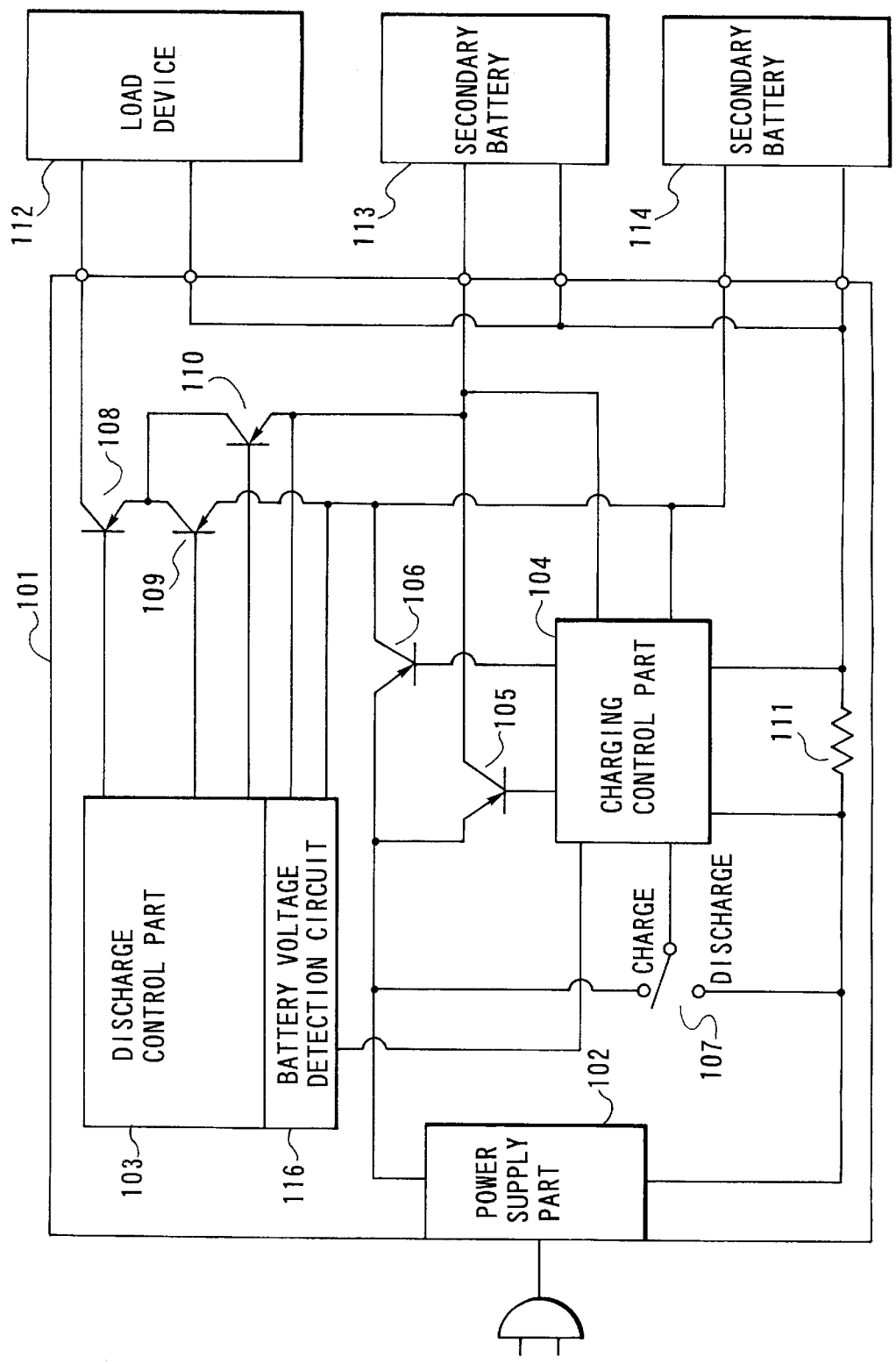
FIG. 9 is a block diagram showing the arrangement of a charging device according to a fourth embodiment of the invention.

FIG. 9 is a block diagram showing a charging system according to a fourth embodiment of the invention. In FIG. 9, reference numerals 101 to 114 denote parts which are the same as those of the second embodiment shown in FIG. 5. In addition to these parts, the fourth embodiment is provided with a battery voltage detection circuit 116 which is arranged to detect the battery voltage of the secondary battery 113 and that of the other secondary battery 114. The fourth embodiment is thus arranged to decide which of these batteries are to be used for discharging according to the battery voltages detected by the detection circuit 116.

Figure 10:
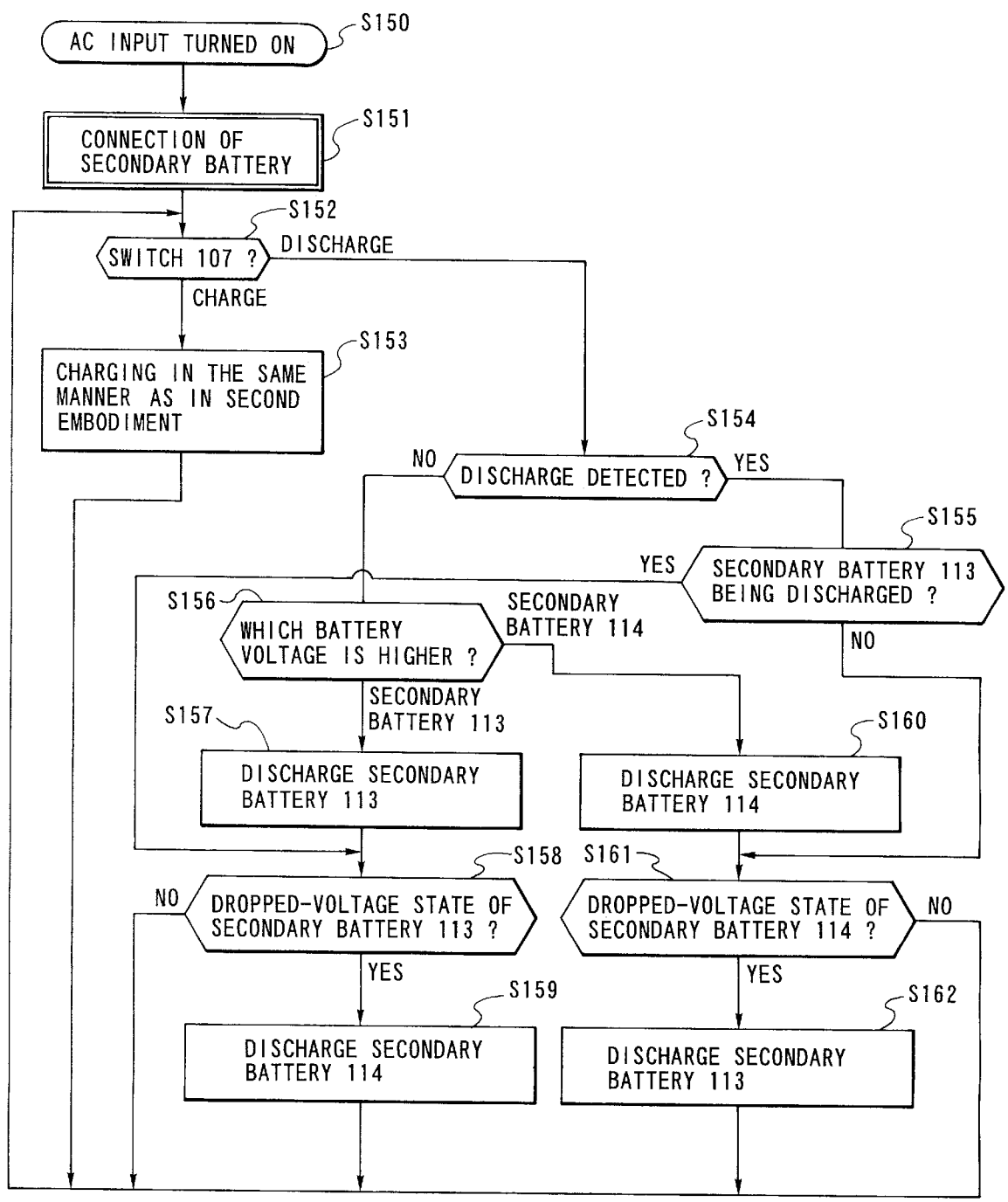
FIG. 10 is a flow chart showing an operation of the charging device in the fourth embodiment.

FIG. 10 is a simplified flow chart showing the actions of the fourth embodiment. Referring to FIG. 10, at a step S150, an AC input is obtained and the flow of operation is in a standby state at its start. At a step S151, the secondary battery 113 or 114 is connected to the charging system. At a step S152, a check is made for the selecting position of the change-over switch 107.

If the position of the change-over switch 107 is found to be on the charge side, the flow proceeds to a step S153 for a charging action. The charging action is performed in the same manner as in the case of the second embodiment. If the position of the change-over switch 107 is found at the step S152 to be on the discharge side, the flow proceeds to a step S154. At the step S154, a check is made to find if the discharge is in process. If so, the flow proceeds to a step S155. At the step S155, a check is made to find if the secondary battery 113 is in process of discharge. If so, the flow proceeds to a step S158. At the step S158, driving the load device 112 with the secondary battery 113 is carried on until a dropped-voltage state of the secondary battery 113 is detected. When the dropped-voltage state of the second battery 113 is detected at the step S158, the flow proceeds to a step S159. At the step S159, the other secondary battery 114 begins to be discharged. In a case where the secondary battery which is currently in process of discharge is found at the step S155 to be the secondary battery 114, instead of the secondary battery 113, the flow proceeds to a step S161. At the step S161, driving with the secondary battery 114 is carried on until a dropped-voltage state of the secondary battery 114 is detected. When the dropped-voltage state of the secondary battery 114 is detected at the step S161, the flow proceeds to a step S162. At the step S162, the secondary battery 113 begins to be discharged.

With the position of the change-over switch 107 found at the step S152 to be on the discharge side and with the check made at the step S154 to find if the charging system is currently in process of discharge, if the charging system is found to be not in process of discharge, the flow proceeds to a step S156. At the step S156, a check is made to find which of the two secondary batteries 113 and 114 has a higher voltage. If the voltage of the secondary battery 113 is found to be higher than that of the secondary battery 114, the flow proceeds to a step S157. At the step S157, the secondary battery 113 begins to be discharged, having priority over the other secondary battery 114. If the secondary battery 114 is found at the step S156 to have a higher voltage, the flow proceeds to a step S160 to begin discharging the secondary battery 114 by giving priority to the secondary battery 114.

As described by way of example above, the fourth embodiment is arranged to perform a selective discharging action by measuring the battery voltages of the secondary batteries and by discharging one of them having a higher voltage than the other. However, it is also possible to arrange the fourth embodiment to have some other modes of operation in addition to the mode described above. For example, in another mode, the secondary battery having a higher battery voltage is first discharged and, after that, when the voltage of the secondary battery drops to a level which is the same as the level of the battery voltage of the other secondary battery, the two secondary batteries are discharged in parallel.

The arrangement of the fourth embodiment, as described above, not only gives the same advantageous effects as the second embodiment but also is capable of discharging beginning with the secondary battery having a higher battery voltage than the other secondary battery.

Figure 11:
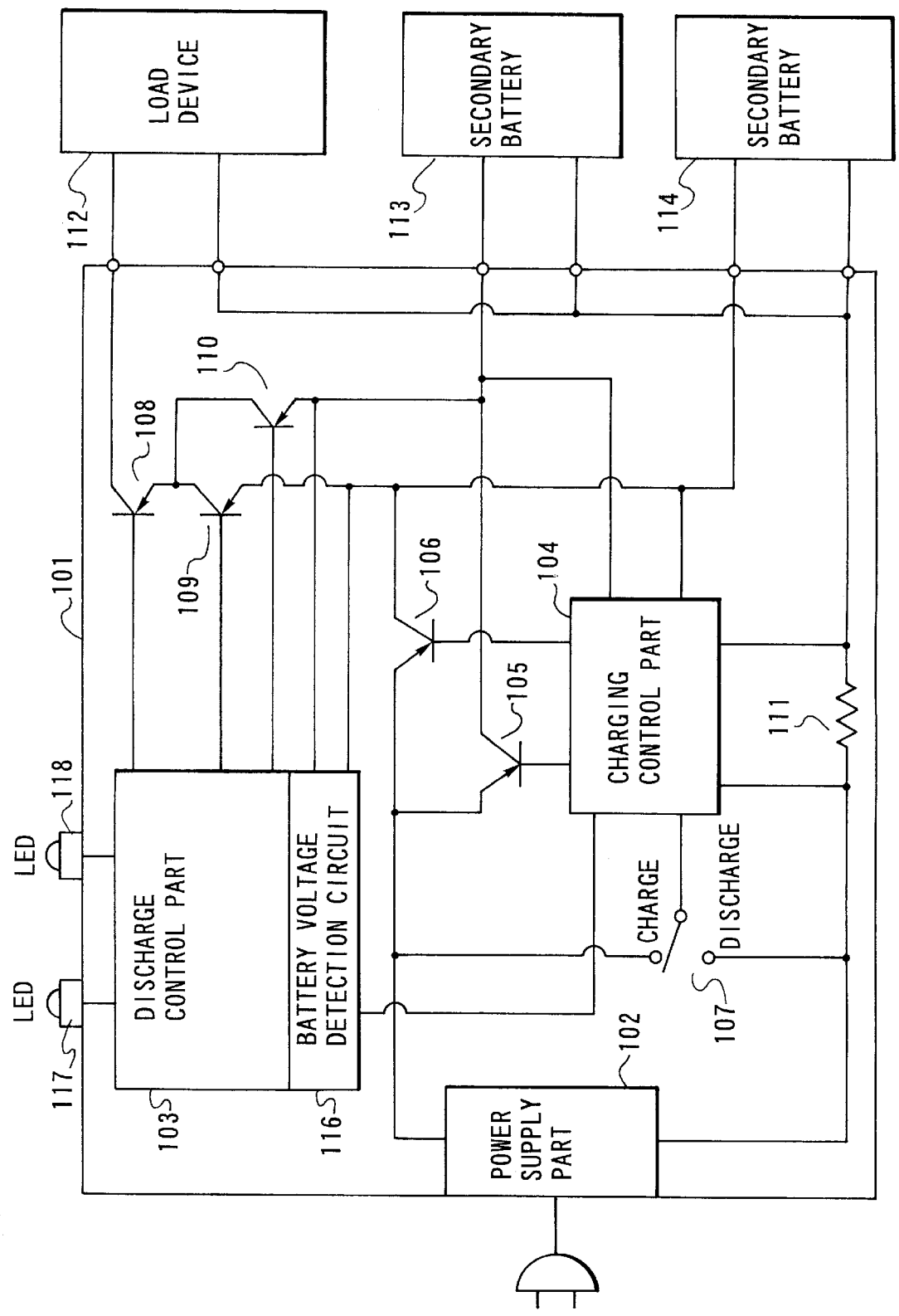
FIG. 11 is a block diagram showing the arrangement of a charging device according to a fifth embodiment of the invention.

FIG. 11 is a block diagram showing a charging system according to a fifth embodiment of the invention. In FIG. 11, reference numerals 101 to 114 denote the same parts as those of the second embodiment shown in FIG. 5. The fifth embodiment is provided with a battery voltage detection circuit 116 which is arranged to detect the battery voltages of the secondary batteries 113 and 114. The fifth embodiment is arranged to discharge electric energy first from one of these secondary batteries having a lower battery voltage than the other. In addition to that, the fifth embodiment is arranged to give warning of a dropped-voltage state for one of the secondary batteries which first comes to show the dropped-voltage state earlier than the other by lighting up either an LED 17 or another LED 18 with the power of the other secondary battery according to the states of these secondary batteries.

Figure 12:
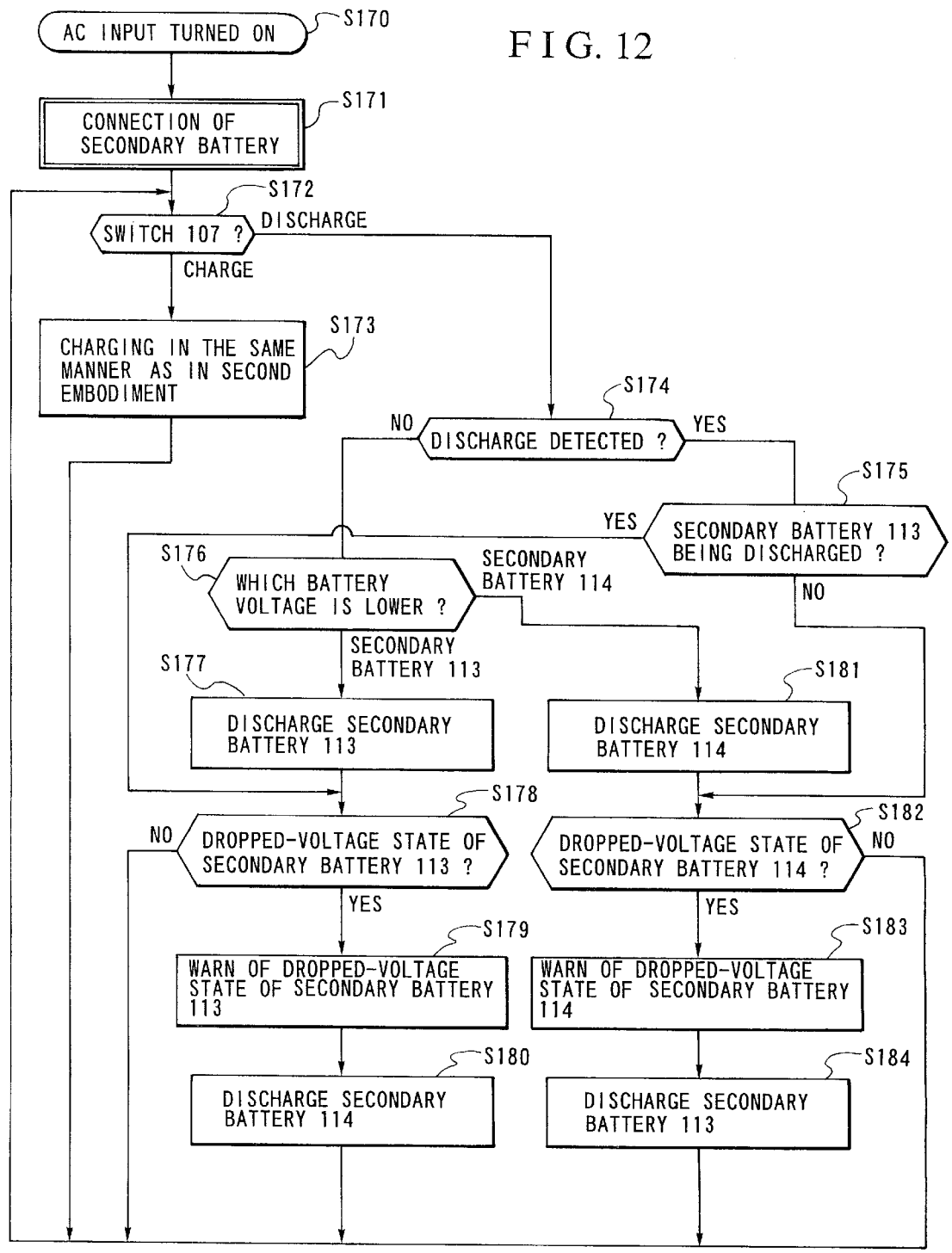
FIG. 12 is a flow chart showing an operation of the charging device in the fifth embodiment.

FIG. 12 is a simplified flow chart showing the actions of the fifth embodiment. At a step S170 of FIG. 12, an AC input is obtained. The flow of operation is at its start in a standby state. At a step S171, either the secondary battery 113 or the other secondary battery 114 is connected to the charging system. At a step S172, a check is made for the selecting position of the change-over switch 107. If the position of the change-over switch 107 is on the charge side, the flow proceeds to a step S173 to perform a charging action on the secondary batteries in the same manner as in the case of the second embodiment.

If the position of the change-over switch 107 is found at the step S172 to be on the discharge side, the flow proceeds to a step S174. At the step S174, a check is made to find if the charging system is currently in process of discharging. If so, the flow proceeds to a step S175. At the step S175, a check is made to find if the discharge is being made from the secondary battery 113. If so, the flow proceeds to a step S178. At the step S178, the discharge from the secondary battery 113 is carried on until a dropped-voltage state of the secondary battery 113 is detected. When the dropped-voltage state of the secondary battery 113 is detected at the step S178, the flow proceeds to a step S179. At the step S179, a dropped-voltage warning against the dropped-voltage state of the secondary battery 113 is made by lighting up the LED 117. At a step S180, the other secondary battery 114 begins to be discharged.

If the discharge is found at the step S175 to be from the secondary battery 114, the flow proceeds to a step S182. At the step S182, the discharge from the secondary battery 114 is carried on until a dropped-voltage state of the secondary battery 114 is detected. When the dropped-voltage state of the secondary battery 114 is detected at the step S182, the flow proceeds to a step S183. At the step S183, a dropped-voltage warning against the dropped-voltage state of the secondary battery 114 is made by lighting up the LED 118. At a step S184, the secondary battery 113 begins to be used for discharging.

With the position of the change-over switch 107 found at the step S172 to be on the discharge side and with the check made at the step S174 to find if the charging system is currently in process of discharge, if the charging system is found to be not in process of discharge, the flow proceeds to a step S176. At the step S176, a check is made to find which of the two secondary batteries 113 and 114 has a lower voltage. If the voltage of the secondary battery 113 is found to be lower than that of the other secondary battery 114, the flow proceeds to a step S177. At the step S177, the secondary battery 113 begins to be discharged, having priority over the other battery 114. After that, at the step S178, a driving action is carried on with the secondary battery 113 until a dropped-voltage state of the secondary battery 113 is detected. When the dropped-voltage state is detected at the step S178, the flow proceeds to the step S179 to give a dropped-voltage warning against the dropped-voltage state of the secondary battery 113. At the step S180, driving with the secondary battery 114 begins. If the secondary battery 114 is found at the step S176 to have a lower voltage, the flow proceeds to a step S181 to begin discharging the secondary battery 114 by giving priority to the secondary battery 114. The flow then proceeds to the step S182 to carry on the driving action with the secondary battery 114 until a dropped-voltage state of the secondary batter 114 is detected. When the dropped-voltage state is detected at the step S182, the flow proceeds to the step S183 to give a dropped-voltage warning against the dropped-voltage state of the secondary battery 114 by using the LED 118. At the step S184, driving with the secondary battery 113 begins.

In the fifth embodiment, the LEDs 117 and 118 are employed as typical warning means against the dropped-voltage states of the secondary batteries 113 and 114. However, the use of LEDs for giving a dropped-voltage warning to the operator may be replaced with some other warning means, such as a warning sound of a buzzer or the like.

In addition to the same advantages as those of the second embodiment, the arrangement of the fifth embodiment described above enables the charging system not only to start discharging the electric energy from one of the secondary batteries having a lower voltage than the other but also to give the dropped-voltage warning.

Figure 13:
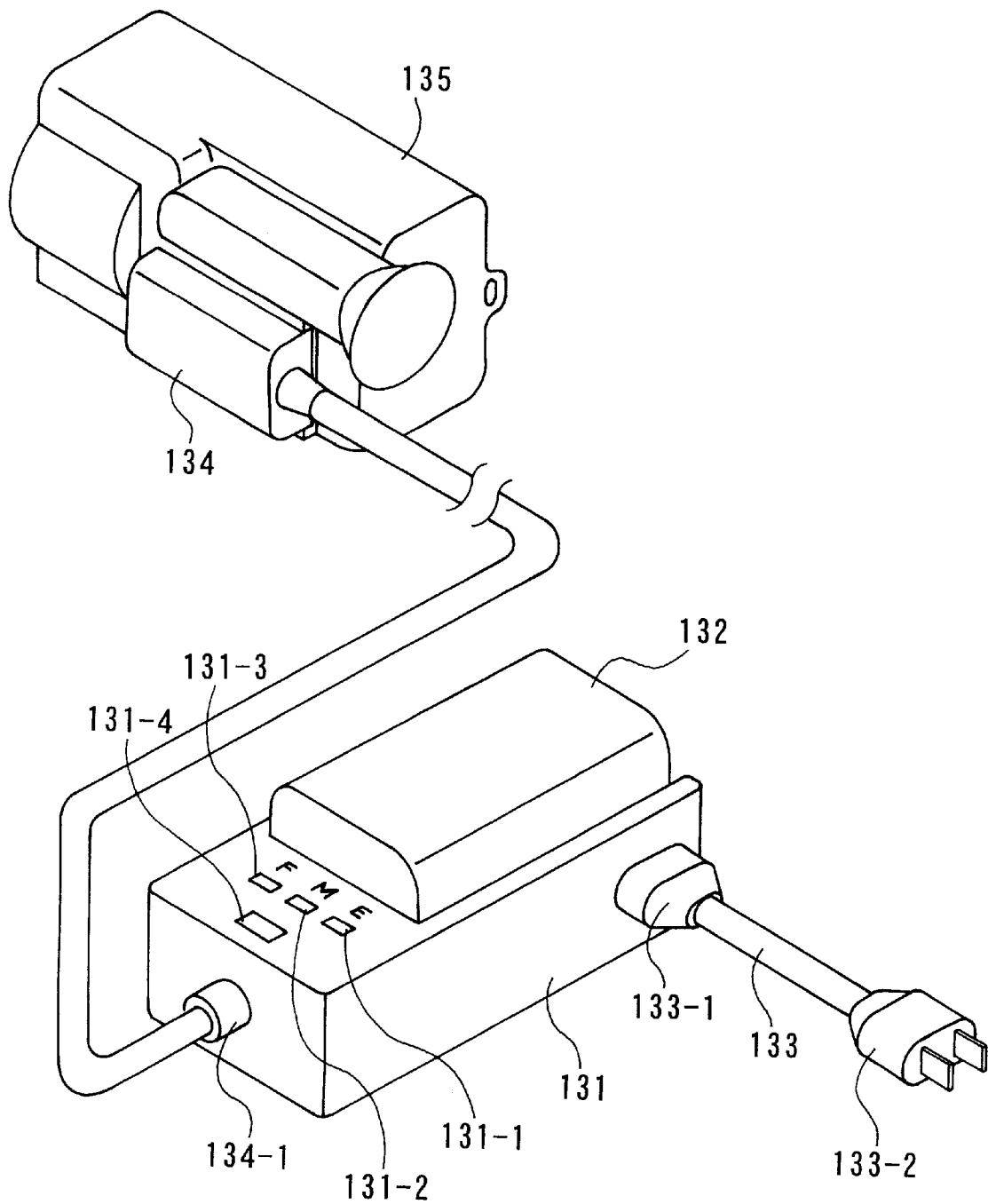
FIG. 13 is a perspective view showing the appearance of a charging device according to a sixth embodiment of the invention.

FIG. 13 is a perspective view showing the appearance of a VTR-integrated type video camera system according to a sixth embodiment of the invention. Referring to FIG. 13, the video camera system includes a charging device (battery charger) 131, a display LED (E) 131-1, a display LED (M) 131-2, a display LED (F) 131-3, a display button 131-4, a secondary battery 132, an AC cable 133, an AC plug 133-1, a socket plug 133-2, a DC coupler 134, a DC plug 134-1, and a VTR-integrated type video camera 135 which is a load to be imposed on the charging device 131.

The secondary battery 132 is connected to the charging device 131 in a detachable state. The AC plug 133-1 and the DC plug 134-1 are also arranged to be detachably attachable to the charging device 131. When an AC power is supplied to the charging device 131 with the socket plug 133-2 inserted into a socket, the charging device 131 begins to charge the secondary battery 132. The state of charging is indicated by the display LED (E) 131-1, the display LED (M) 131-2 and the display LED (F) 131-3. When the amount of charging is 0%, the display LED (E) 131-1 alone lights up. When the amount of charging reaches 50%, the display LED (E) 131-1 and the display LED (M) 131-2 light up for indication. All the display LED (E) 131-1, the display LED (M) 131-2 and the display LED (F) 131-3 light up when the amount of charging reaches 100%. The number of LEDs lighted up thus increases accordingly as the amount of charging increases.

When the supply of the AC power from the AC cable 133 comes to a stop, the mode of the system changes to a mode in which power is supplied from the secondary battery 132 via the DC coupler 134 to the VTR-integrated type video camera 135 which becomes a load. When the display button 131-4 is pushed in this mode, a residual capacity is displayed for a period of several seconds. In this instance, all the display LED (E) 131-1, the display LED (M) 131-2 and the display LED (F) 131-3 light up when the residual capacity is 100%. The display LED (E) 131-1 and the display LED (M) 131-2 light up when the residual capacity is 50%. The display LED (E) 131-1 alone lights up when the residual capacity comes close to 0%. The number of LEDs lighting up thus decreases accordingly as the residual capacity decreases.

The arrangement mentioned above enables the sixth embodiment to show the state of charging when the secondary battery 132 is in process of charging and also to show the residual capacity of the secondary battery 132 when the electric energy is supplied from the secondary battery to the apparatus which is a load on the secondary buttery 132. According to the arrangement, both the state of charging and the residual capacity can be shown by means of one and the same display device. The arrangement thus enhances the visibility of the display and permits simplification of the structure and reduction in cost.

Figure 14:
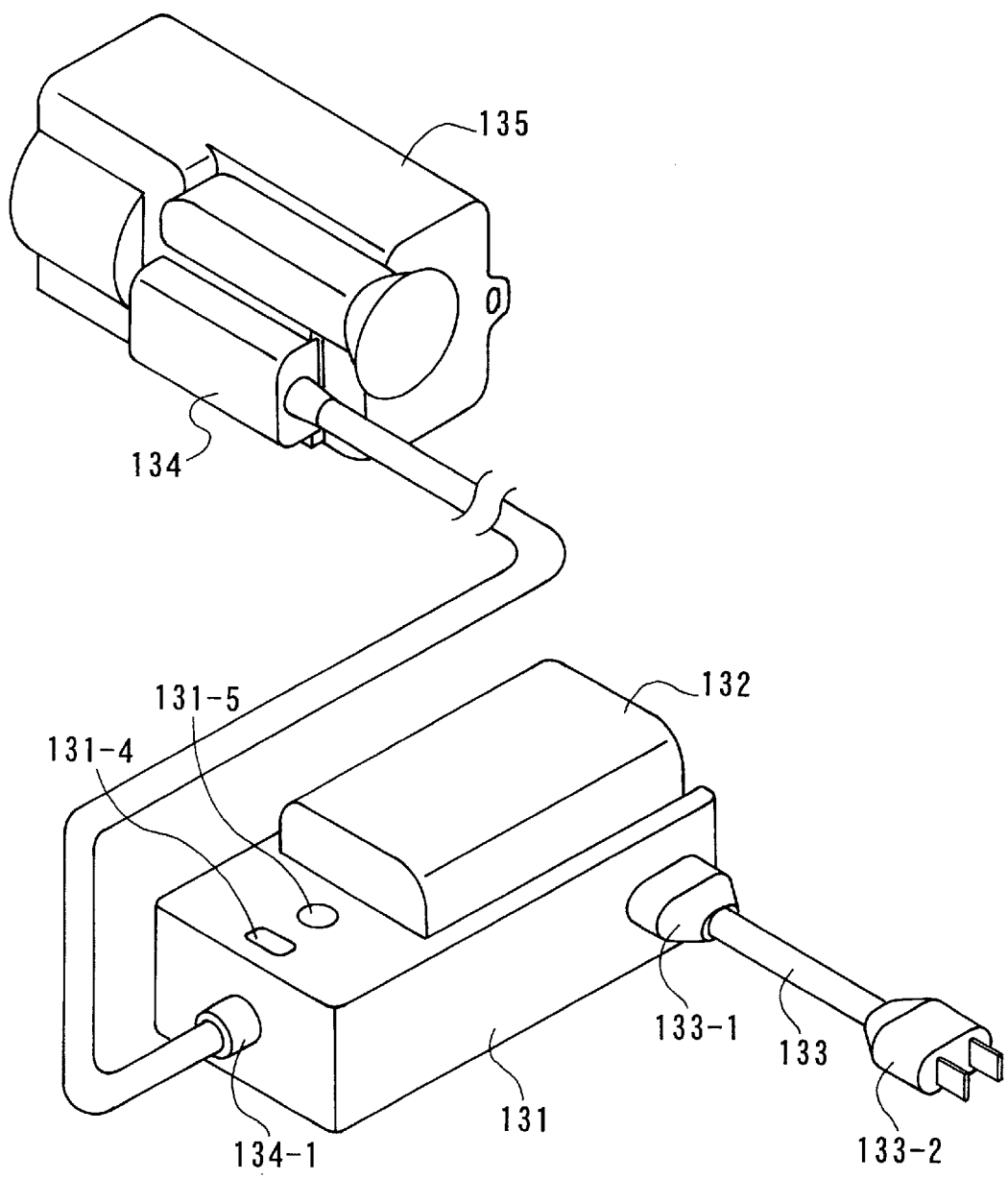
FIG. 14 is a perspective view showing the appearance of a charging device according to a seventh embodiment of the invention.

FIG. 14 is a perspective view showing the appearance of a VTR-integrated type video camera system according to a seventh embodiment of the invention. Referring to FIG. 14, the camera system includes a charging device 131, a display button 131-4, a display LED 131-5 arranged to emit two colors including orange and green colors, a secondary battery 132, an AC cable 133, an AC plug 133-1, a socket plug 133-2, a DC coupler 134, a DC plug 134-1, and a VTR-integrated type video camera 135 which becomes a load.

Figure 15:
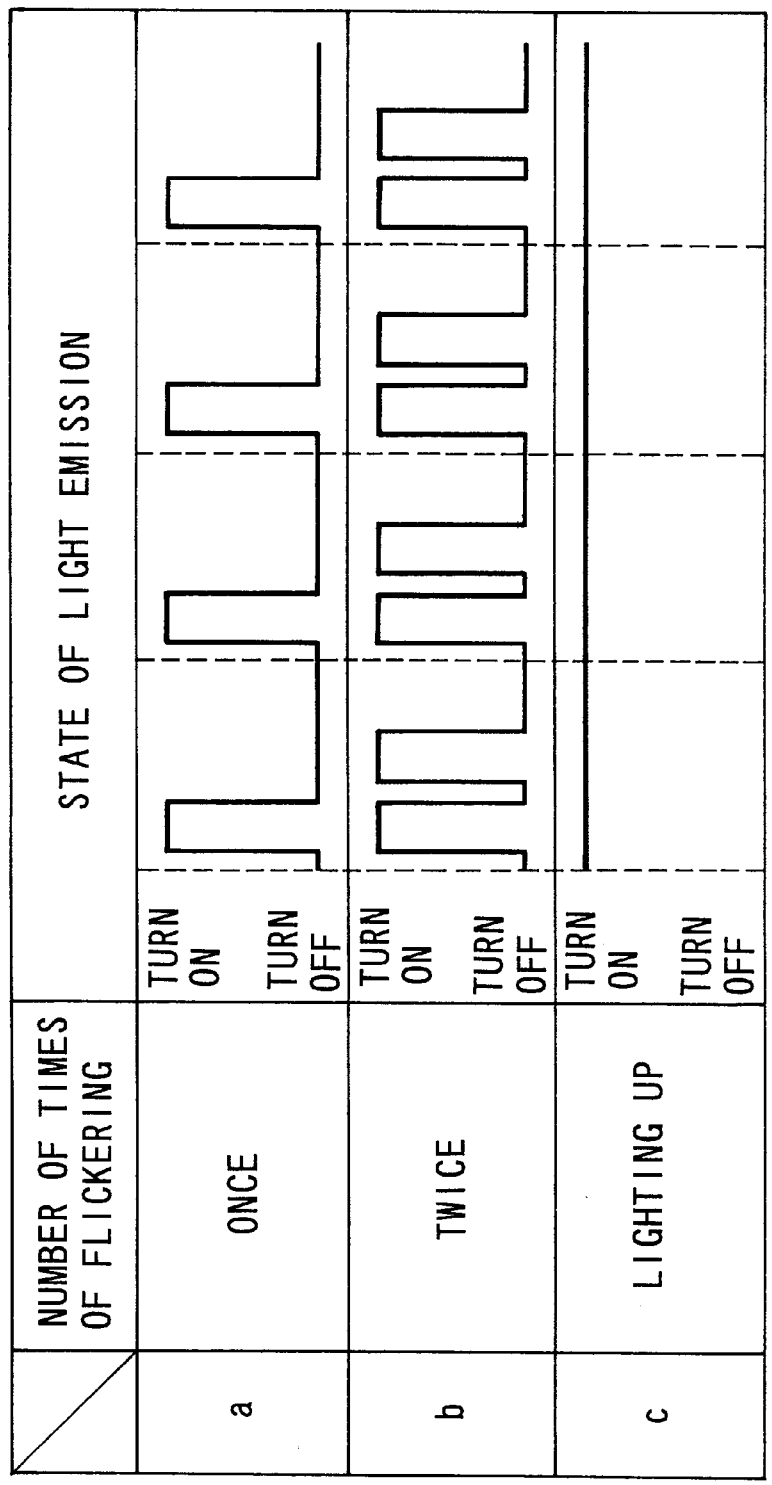
FIG. 15 is a diagram for explaining an operation of the charging device in the seventh embodiment.

FIG. 15 shows the various states of light emission from the display LED 131-5. In FIG. 15, reference symbol "a" denotes a state of flickering once. Reference symbol "b" denotes a state of flickering twice. Reference symbol "c" denotes a state of lighting up.

The secondary battery 132 is detachably connected to the charging device 131. The AC plug 133-1 and the DC plug 134-1 are also arranged to be detachably attachable to the charging device 131. When an AC power is supplied to the charging device 131 with the socket plug 133-2 inserted into a socket, the charging device 131 begins to charge the secondary battery 132. The state of charging is indicated by causing the LED 131-5 to emit an orange color light in a flickering manner or in a lighting-up manner. The orange color light of the LED 131-5 is caused to flicker once (a) when the amount of charging is at 0%, to flicker twice (b) when the amount of charging reaches 50% and to light up (c) when the amount of charging reaches 100%. The number of times of flickering of the orange color light is thus arranged to increase accordingly as the amount of charging increases.

When the supply of the AC power from the AC cable 133 comes to a stop, the mode of the system changes to a mode in which power is supplied from the secondary battery 132 through the DC coupler 134 to the VTR-integrated type video camera 135 which becomes a load. When the display button 131-4 is pushed in this mode, a residual capacity of the secondary battery 132 is displayed by causing the display LED 131-5 to emit or flicker a green color light. The green color light of the display LED 131-5 is caused to light up (c) when the residual capacity is at 100%, to flicker twice (b) when the residual capacity drops to 50% and to flicker once (a) when the residual capacity drops close to 0%. The number of flickering of the green color light of the display LED 131-5 is thus arranged to decrease accordingly as the residual capacity of the secondary battery 132 drops further.

According to the arrangement of the seventh embodiment described, both the amount of charging and the amount of residual capacity of the secondary battery can be displayed by means of a single LED. The arrangement permits simplification of structure and reduction in cost and makes it easier to secure a display space which tends to present a problem with respect to reduction in size of the charging device.

What is claimed is:

1. A charging device for charging a secondary battery, comprising:

charging means for performing a charging action on the secondary battery;

power supplying means for supplying power to a load device connected to said charging device;

mode change-over means for selecting between a charge mode in which the charging action on the secondary battery is performed and a discharge mode in which power is supplied to the load device; and control means for, when the charge mode is selected by said mode change-over means, causing said charging means to perform the charging action on the secondary battery and for, when the discharge mode is selected by said mode change-over means, causing said power supplying means to supply power from said secondary battery to the load device in a state in which the secondary battery is mounted on said charging device, said charging device further comprising dropped-voltage state detecting means for detecting a dropped-voltage state of the secondary battery, wherein said control means allows a mode to be set as selected by said mode change-over means when the secondary battery is decided to be not in the dropped-voltage state by said dropped-voltage state detecting means, and causes said charging means to perform the charging action on the secondary battery irrespectively of a state of said mode change-over means when the secondary battery is decided to be in the dropped-voltage state by said dropped-voltage state detecting means.

2. A charging device according to claim 1, wherein said power supplying means is controlled to be inoperative while said charging means is in action.

3. A charging device according to claim 2, wherein said changing means is controlled to be inoperative while said power supplying means is in action.

4. A charging device according to claim 3, wherein the secondary battery is detachably mountable on said charging device.

5. A charging device according to claim 1, wherein said mode change-over means is composed of a manual switch which is manually switchable.

6. A charging device comprising:

charging means for charging a secondary battery connected to said charging device;

selecting means for selecting between a first mode to charge the secondary battery and a second mode to supply power from the secondary battery to a load device, wherein said charging device displays both of a charged state of the secondary battery and a power supply state of the secondary battery on a single display device and displays the charged state with light of a first color and the power supply state with light of a second color different from the first color.

7. A charging device according to claim 6, wherein an amount of charging of the secondary battery is displayed on the display device at the time of charging by said charging means and a residual capacity of the secondary battery is displayed on the display device at the time of supplying power.

8. A charging device according to claim 6, wherein said display device controls flickering of the light of the first color to display an amount of charge of the secondary battery.

9. A charging device having a function of performing a charging action on a detachably mountable secondary battery and a function of switching between the charging action and a secondary battery driving action in which power is supplied from the secondary battery to a load device connected to said charging device, wherein said charging device allows a plurality of secondary batteries to be mounted thereon for the charging action and the secondary battery driving action, and wherein in the secondary battery driving action, the plurality of secondary batteries are continuously usable by serially switching the plurality of secondary batteries or by connecting the plurality of secondary batteries in parallel, said charging device further comprising a change-over switch for switching of order of priority of using the plurality of secondary batteries mounted on said charging device for the charging action or the secondary battery driving action.

10. A charging device according to claim 9, wherein the switching of the plurality of secondary batteries mounted on said charging device for the secondary battery driving action is automatically performed on the basis of values obtained by measuring battery voltages of the plurality of secondary batteries.

11. A charging device according to claim 10, wherein the switching of the plurality of secondary batteries mounted on said charging device for the secondary battery driving action is performed such that a secondary battery found to have a lower voltage by a result of measurement of the battery voltages is first discharged, and a dropped-voltage warning is given against a dropped-voltage state of any of the plurality of secondary batteries by a display device.

12. A method for controlling a charging device having a first mode to charge a secondary battery and a second mode to supply power from the secondary battery to a load device, said method comprising steps of selecting between the first mode and the second mode, and displaying both of a charged state of the secondary battery and a power supplying state of the second battery on a single display device, displaying the charged state with light of a first color and the power supplying state with light of a second color different from the first color.

13. A method according to claim 12, wherein said load device is an image processing apparatus.

14. A method according to claim 12, wherein flickering of the light of the first color is controlled to display an amount of charging of the secondary battery.

15. A charging device according to claim 12, wherein said load device is an image processing apparatus.

* * * * *